United States Patent [19]
Avery et al.

[11] 4,158,591
[45] Jun. 19, 1979

[54] SOLAR CELL MANUFACTURE

[75] Inventors: James E. Avery, Burbank; Charles F. Gay, Tujunga, both of Calif.

[73] Assignee: Atlantic Richfield Company, Los Angeles, Calif.

[21] Appl. No.: 899,436

[22] Filed: Apr. 24, 1978

[51] Int. Cl.² ............... H01L 21/22; H01L 21/24; H01L 21/263; H01L 21/308
[52] U.S. Cl. .................... 156/643; 29/572; 29/580; 136/89 CC; 148/178; 148/185; 148/186; 156/648; 156/656; 156/657; 156/661; 156/662
[58] Field of Search ............ 156/643, 646, 648, 649, 156/656, 657, 661, 662; 148/178, 185, 186; 29/572, 580; 136/89 CC; 427/88

[56] References Cited
U.S. PATENT DOCUMENTS

| 3,460,240 | 8/1969 | Tarneja et al. | 136/89 CC |
|---|---|---|---|
| 3,589,946 | 6/1971 | Tarneja et al. | 136/89 CC |
| 3,753,809 | 8/1973 | Gaier et al. | 148/186 |
| 3,758,348 | 9/1973 | Whigham et al. | 148/185 |
| 3,795,557 | 3/1974 | Jacob | 156/646 |
| 3,948,682 | 4/1976 | Bordina et al. | 156/648 |
| 3,966,577 | 6/1976 | Hochberg | 156/643 |

OTHER PUBLICATIONS

Bassous, "Fabrication . . . Dimensions" *IBM Technical Disclosure Bulletin* vol. 20, No. 6, (Nov. 1977), pp. 2474–2479.

*Primary Examiner*—Jerome W. Massie
*Attorney, Agent, or Firm*—Roderick W. MacDonald

[57] ABSTRACT

A method for manufacturing solar cells wherein a plurality of wafers of a first conductivity type are assembled and thereafter doped with an active impurity of an opposite conductivity imparting type to establish a p-n junction. Thereafter front and back contacts are formed on the wafers by metallization, the back contact material being chosen so that it penetrates any p-n junctions present in the area of the back contact, if any, and thereby forms a low resistance ohmic contact through any such junction. Thereafter the contact containing wafers are coin stacked and plasma etched so that the edge faces of the coin stacked wafers have removed therefrom sufficient p-n junction to electrically isolate the front junction from the back junction or junctions.

11 Claims, 12 Drawing Figures

SOLAR CELL MANUFACTURE

BACKGROUND OF THE INVENTION

Solar cells normally have very shallow p-n junctions so that they may capture the blue end of the photo spectrum. Typically, the p-n junction lies approximately 0.3 micrometers beneath the surface of the semiconductor wafer. If, during the normal processing which occurs in the manufacture of solar cells subsequent to formation of the p-n junction, the surface of the wafer in which the p-n junction is formed is maltreated, the junction can be destroyed and the cell become useless.

In forming the junction, the semiconductor wafer is exposed at appropriate temperatues to a source of doping material selected to provide the desired p-n junction.

For example, in a boron doped, silicon semiconductor wafer which is a p conductivity type wafer, a layer of phosphorous pentoxide glass (active impurity compound) is deposited over the entire surface of the wafer through chemical vapor deposition by flowing phosphorous oxychloride and oxygen into a diffusion chamber using a carrier gas of dry nitrogen. The interreaction of the silicon wafer with these gases and the formation of the phosphorous pentoxide glass provides sufficient phosphorous atoms to diffuse from the glass into the silicon surface in accordance with well known diffusion characteristics to provide the desired p-n junction.

To form the operative solar cell, however, the layer of phosphorous pentoxide glass is usually, but not necessarily, removed and the diffused layer of silicon must be removed from the silicon wafer except for one surface thereof so that appropriate contacts can be attached to the wafer.

In the prior art, this undesired phosphorous pentoxide glass layer and the undesired portion of the phosphorous converted layer of silicon have been removed by acid etching utilizing a mixture of nitric acid and hydrofluoric acid. To protect the surface of the cell having the desired shallow junction therein, it has been customary to affix a mask, such as a acid etch resist mask, thereto. It has been found that the acid etch often penetrates pin holes or other irregularities in the mask, thus attacking the silicon wafer therebeneath and damaging the junction. In the event the etch resist mask is effective to preclude undesirable etching, it must thereafter be removed with an appropriate solvent.

In an attempt to avoid the utilization of the etch resist mask, wafers have been affixed to a tape carrier having a proper adhesive on the surface thereof with the surface of the wafer to be protected affixed to the adhesive. Such obviously depends on the quality of the tape adhesive and furthermore, the tape in such systems can normally be used only once, thus injecting into the system an additional expense above and beyond the utilization of the etch resist type masks.

Irrespective of the type of masking technique which is utilized, the acid etch causes an exothermic reaction with silicon, thus creating heat which increases the temperature of the silicon wafer. As the temperature of the silicon wafer increases, the reaction rate between the etch and the silicon wafer also increases. Such phenomena obviously introduces control problems which must be carefully solved to preclude a runaway etch from occurring.

In any acid etching technique there are several problems relating to the undercutting of the silicon wafer by the acid etch, that is, those portions of the wafer immediately beneath the mask tend to be eaten away by the etch and undercut, thus tending to destroy the integrity of the junction and further providing access areas for the etch to reach across the surface of the wafer.

In an attempt to solve the foregoing problems a water jig etching technique was developed. Under this technique a water jet is caused to flow on the side of the wafer which is to be protected from the etch. The wet acid etch is applied then to the remainder of the wafer from which the glass and the converted silicon is to be removed. The water jet appears to preclude the etch from flowing around to the undesired portion of the wafer and also cools the wafer to thus control the etch rate. This system, however, requires a continuous water flow and a requirement to control the drainage of the water-acid mixture.

In any of the systems utilizing the acid etch there is a requirement that the wafer be water rinsed and dried subsequent to the etching before any additional operations upon the wafer may be accomplished.

Plasma etching was introduced to overcome some of the foregoing difficulties. Plasma etching is, at this time, well known in the semiconductor processing art and is described in various publications, for example, U.S. Pat. No. 3,795,557 for PROCESS AND MATERIAL FOR MANUFACTURING SEMICONDUCTOR DEVICES, issued Mar. 5, 1974 which is incorporated herein by reference.

Plasma etching, though quite successful when properly controlled, nonetheless still introduced a number of problems. It was extremely difficult to obtain a cross-wafer uniformity. That is, the nature and extend of the etching between two points on the same wafer was not always the same. In addition thereto, there were differences in the etching between two wafers in the same run of a plasma etching process. It was also found that differences occurred between two wafers which were run in different runs of the same etching process. It was determined that some of the causes for this nonuniformity in etching occurred as a result of variations in local temperature on the surface of the wafer during etching. The peculiar nature of the plasma etching process caused the elements which accomplished the etching to concentrate their energy on the wafer's periphery thus overheating it. The overheating then in turn enhanced the etching, thus causing the peripheral regions of the wafer to become severely overetched before the desired etching could be achieved along the surface of the wafer and particularly at the center thereof. To eliminate this difficulty, various steps have been taken in the plasma etching arts. These are to remove the wafers from the active plasma region, to limit the pressure of the plasma to less than 1 Torr, to lay the wafers on a conductive backing plate larger than the wafer itself or to place the wafers in a perforated metal cylinder during etching to shield the wafers from ions, radiation and electric fields, thus allowing only the free radicals to enter and contact the wafers.

Even though the plasma etching is a dry process, it would, at first blush, still appear to require a masking technique of some type to obtain the desired etching, particularly since the wafers are placed within the reaction chamber of the plasma etching apparatus, thus being exposed to the etchant contained therein. Thus one of the features causing wet etching to be undesirable appears to be carried over to the plasma etching process as well.

One method proposed for manufacturing solar cells utilizing plasma etching techniques is referred to as the back etching method. In the discussion of this invention reference will be made to the "front" and "back" of a solar cell. A solar cell normally has two large surface areas joined by a thin edge face. One of the surface areas is designated to point in the general direction of the light source whereas the opposing large surface area faces away from the general direction of the light source. The large surface area of the cell which is oriented in the general direction of the light source is referred to as the front and contacts on that surface are referred to as front contacts. Similarly, the large surface area opposing the front surface is referred to as the back and the contact thereon referred to as the back contact.

In the back etching process the plurality of wafers of the first conductivity type are assembled in spaced apart pairs with adjacent surfaces of each pair of wafers in contact with one another. These spaced apart contiguous pairs of wafers are then subjected to conventional diffusion with an active impurity of an opposite conductivity imparting type to establish the desired p-n junction in the wafer. After diffusion each of the pairs of wafers are reversed to bring those surfaces which were exposed to the diffusant into contact with each other and, therefore, make the two that were in contact with one another during diffusion now be the outer, exposed surfaces of the contiguous pair. These reversed pairs were then plasma back etched to remove any active impurity compounds formed and to remove the p-n junction from the exposed back side. Thereafter contacts were applied to the front and back of the wafer to form the operative source cell.

SUMMARY OF THE INVENTION

Surprisingly, it was discovered that back etching, including plasma back etching, was not necessary in order to form an operational cell and this invention is directed toward the manufacturing method which allows the elimination of the back etching step.

In accordance with this invention there is provided a method for manufacturing solar cells wherein a plurality of wafers of a first conductivity type as assembled. The wafers can be assembled in pairs as with the heretofore described plasma back etching process but this pair assembly is not required by this invention. If desired the wafers can be assembled so that each wafer is spaced apart from the adjacent wafers on either side thereof. The assembled wafers are then subjected to a step which introduces an active impurity of an opposite conductivity imparting type to establish the desired p-n junction in the wafer. Front and back contacts are then formed on the wafer. Note that the impurity introduction and front and back contact formation steps are carried out prior to any etching. After the contacts have been formed on the wafers, they are then coin stacked contiguous with one another as will be disclosed hereinafter in greater detail and subjected to plasma etching in the coin stacked configuration so that only the edge faces of the coin stacked wafers are etched. This etching step removes sufficient p-n junction from the edge faces to electrically isolate the front p-n junction. In the contact application stage the back contact is chosen to be of a material such that the back contact after being formed penetrates any p-n junction present on the back side of the wafer thereby forming a low resistance ohmic contact to the bulk first conductivity type material thereby leaving only the desired front p-n junction.

Accordingly, this invention, in contrast to the plasma back etching method eliminates back etching all together and allows all wafers to be contiguous with one another during the plasma etching step, as opposed to spaced apart pairs in the plasma back etching method, so that a much larger number of wafers are treated to plasma etching at the same time by this invention's plasma edge etching technique than the prior art technique including the plasma back etching technique.

Accordingly, it is an object of this invention to provide a new and improved method for manufacturing solar cells. It is another object to provide a new and improved method for employing plasma etching in the manufacture of solar cells. It is another object to provide a new and improved plasma etching technique as applied to the manufacture of solar cells.

Other aspects, objects and advantages of this invention will be apparent to those skilled in the art from this disclosure and the appended claims.

DETAILED DESCRIPTION OF THE INVENTION

Figure 1:
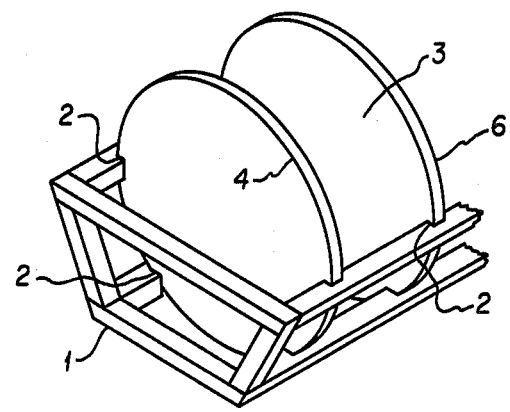
FIG. 1 is a perspective view of a plurality of individual spaced apart semiconductor wafers assembled in a diffusion boat.

FIG. 1 shows a typical diffusion boat 1 constructed, for example, of quartz. The boat has a plurality of slots 2 formed on the sides and bottom thereof not only to receive a single wafer with appropriate space 3 between the wafers to allow the diffusion gases to totally surround the wafer during the diffusion process. Boat 1 carries a plurality of wafers, e.g., about 24, as represented by wafers 4 and 6.

Although this invention is described hereinafter in relation to the well known gaseous diffusion mechanism, it should be understood that other known doping techniques can be employed in this invention, e.g., ion implantation, solid state diffusion, and the like.

Single wafers in individual slots 2 are normally used in this invention, although pairs of wafers can be employed in single slot 2 so that the adjacent surfaces of a given pair of wafers are in contact with one another when in a single slot 2. When wafers are assembled in spaced apart pairs, the contact between the surfaces of adjacent wafers in a given pair function as a diffusion mass so that very little of the diffusing impurity will reach the contacting wafer surfaces of a pair of wafers.

Figure 2:
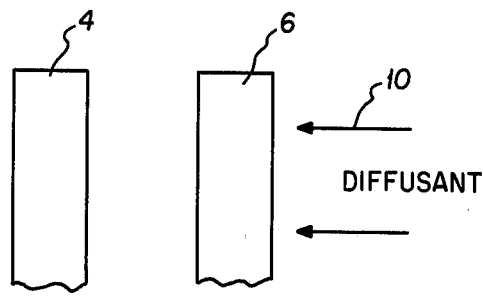
FIGS. 2 through 4 are cross-sectional views of a portion of a pair of spaced apart semiconductor wafers at various stages in the manufacture thereof.

FIG. 2 shows individual spaced apart wafers 4 and 6 when boat 1 is inserted in a conventional diffusion furnace and a diffusant is caused to pass over the heated wafers as represented by arrows 10.

Figure 3:
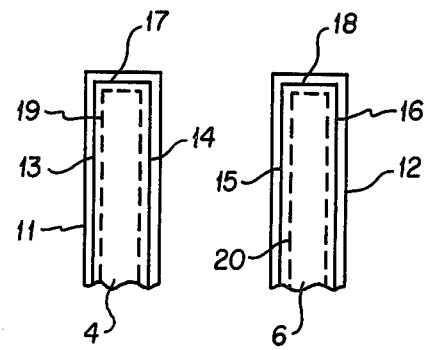

After sufficient time has expired in the diffusion furnace, the wafers will appear as illustrated in FIG. 3. Taking for example a silicon wafer which is originally doped with boron and which is diffused with phosphorous as an active impurity of an opposite conductivity imparting type which phosphorous, when diffused into the boron containing silicon establishes the desired p-n junction in the wafer, wafers 4 and 6 before diffusion will be of the p conductivity type since they have boron impurities dispersed throughout. After diffusion treatment with a phosphorous source as described for FIG. 2, wafers 4 and 6 will have a layer of phosphorous pentoxide glass 11 and 12, respectively, covering both large surface areas, 13 and 14 for wafer 4, and 15 and 16 for wafer 6. The phosphorous oxide glass coating will also cover the thin edge faces 17 and 18 of wafers 4 and 6, respectively.

Subsequent to the formation of the phosphorous oxide glass layer on the wafers and diffusion of the active impurity phosphorous from the glass into the wafers, a p-n junction is now present in the wafers as indicated by reference numeral 19 for wafer 4 and reference numeral 20 for wafer 6. This p-n junction is coextensive with large surface sides 13 through 16 and edge faces 17 and 18. Normally, at this stage, prior art procedures call for back etching the wafers to remove the phosphorous oxide glass and the p-n junction from the large surface area side of each wafer which is ultimately going to become the back side of the operational solar cell. Such a back etching process, whether chemical, plasma, or otherwise, is obviated by this invention. Rather, in accordance with one embodiment of this invention as shown in FIG. 4, wafers 4 and 6 are treated for removal of the phosphorous oxide layers such as by dipping the entire wafer in hydrofluoric acid, or subjecting the wafer to a plasma hydrogenfluoride treatment, or some other treatment which will remove the active impurity compound coating thereby leaving the wafers with a p-n junction on both its large area surfaces and its small edge face.

Removal of the active impurity compound coating just described is not required by this invention. For example, by using known diffusion or other techniques such coating may be utilized with photolithography to define areas for contact metallization.

In accordance with this embodiment of the invention, front and back contacts are formed on the wafer such as by metallization.

Figure 4:
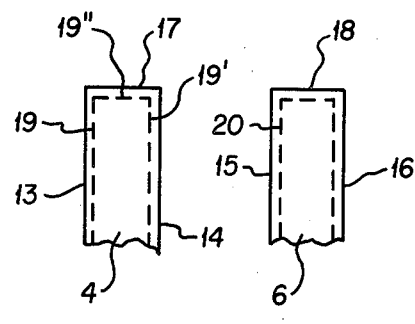
Figure 5:
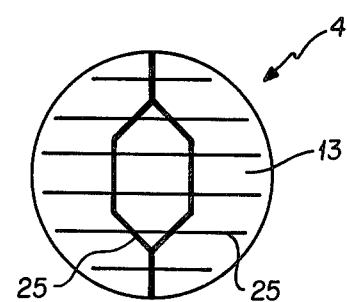
FIG. 5 shows the front of a silicon wafer after the front contacts have been applied thereto.

Take for example wafer 4 of FIG. 4 and assuming that large area surface 13 is designated as the front or light oriented surface for the wafer, the contact grid will be applied to surface 13 in conventional manner for collecting electrical charges from front junction 19. The front contact grid is shown in FIG. 5 by reference numeral 25. The front contact grid in this invention can be any material conventionally used for making solar cells.

Figure 6:
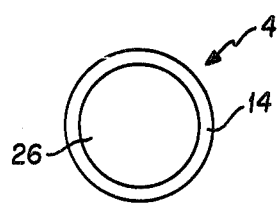
FIG. 6 shows the back of the silicon wafer of FIG. 5 after the back contact has been applied thereto.

FIG. 6 shows the opposing or back large area surface 14 or wafer 4 which has applied thereto circular back contact 26. In this invention the back contact material is chosen so that it will penetrate upon heating or other suitable treatment back p-n junction 19' as shown in FIG. 4 and form a low resistance ohmic contact through back p-n junction 19' so that back contact 26 is in direct electrical contact with the interior p conductivity portion of wafer 4 as will be shown in greater detail hereinafter in FIGS. 9 and 10. This leaves only the desired front p-n junction 19 as far as the large area surfaces 13 and 14 of wafer go. The edge face p-n junction 19'' must still be dealt with and is quickly and conveniently disposed of by the coin stacking and plasma edge etching step of this invention which follows the contact forming step just discussed. Some known techniques provide more than one back junction, but this invention and the above discussion in this paragraph applies whether there is one or more than one back junction present.

Figure 7:
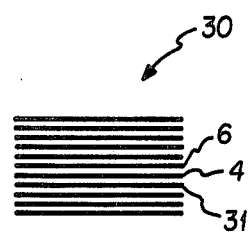
FIG. 7 shows a plurality of cells such as cells shown in FIGS. 5 and 6 which are coin stacked in accordance with this invention prior to the plasma edge etching.

FIG. 7 shows the coin stacking technique of this invention which employs simple forming, vertically or horizontally or at any angle therebetween, a stack of wafers such as wafer 4 of FIGS. 5 and 6 much as one would form a stack of silver dollars, each wafer being contiguous with two other wafers, i.e., no deliberate spacing between any adjacent wafers. Thus, as shown in FIG. 7, wafer 4 in the center part of wafer stack 30 has in contact with opposing sides thereof other similarly prepared wafers 6 and 31.

Figure 9:
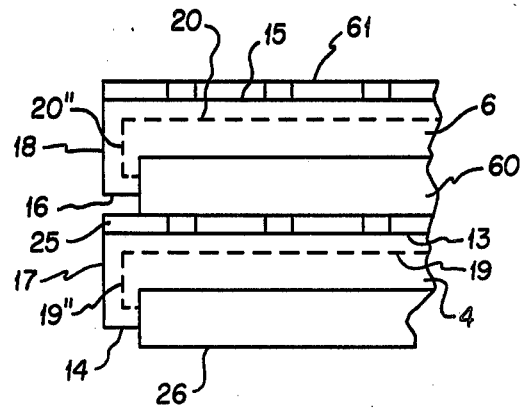
FIG. 9 shows a partial cross-sectional view of two wafers such as the wafers shown in FIGS. 5 and 6 which are coin stacked in the manner shown in FIG. 7.

By forming the coin stack of this invention, primarily only the edge faces such as edge faces 17 and 18 of wafers 4 and 6 of FIG. 4 are exposed although because of the stand-off effects of the front and back contact, a little bit of the periphery of the large area surfaces are exposed as will be shown in greater detail in FIG. 9.

The coin stacked wafers are then subjected to plasma etching primarily to etch away the edge face p-n junctions of the wafers, e.g., edge face p-n junction 19'' of wafer 4 in FIG. 4. By removal of sufficient of the edge face p-n junctions of the wafers, the desired front p-n junction, e.g., front junction 19 of wafer 4 in FIG. 4, is electrically isolated since the edge p-n junctions if left in place would effectively have formed shunts between the front and back contacts. Thus, charge carriers (electrons and holes) generated in the p conductivity portion of the wafer by the absorption of photons must pass through the body of the wafer in known manner to generate electricity which can be removed from the operational cell in known manner by way of the front and back contact since the front p-n junction is electrically isolated due to the removal of the shunting edge face p-n junction.

The plasma etching apparatus and process used for this invention are known in the art, and applicable apparatus for example, being fully and completely disclosed in U.S. Pat. No. 3,795,557, the disclosure of which is incorporated herein by reference.

Figure 8:
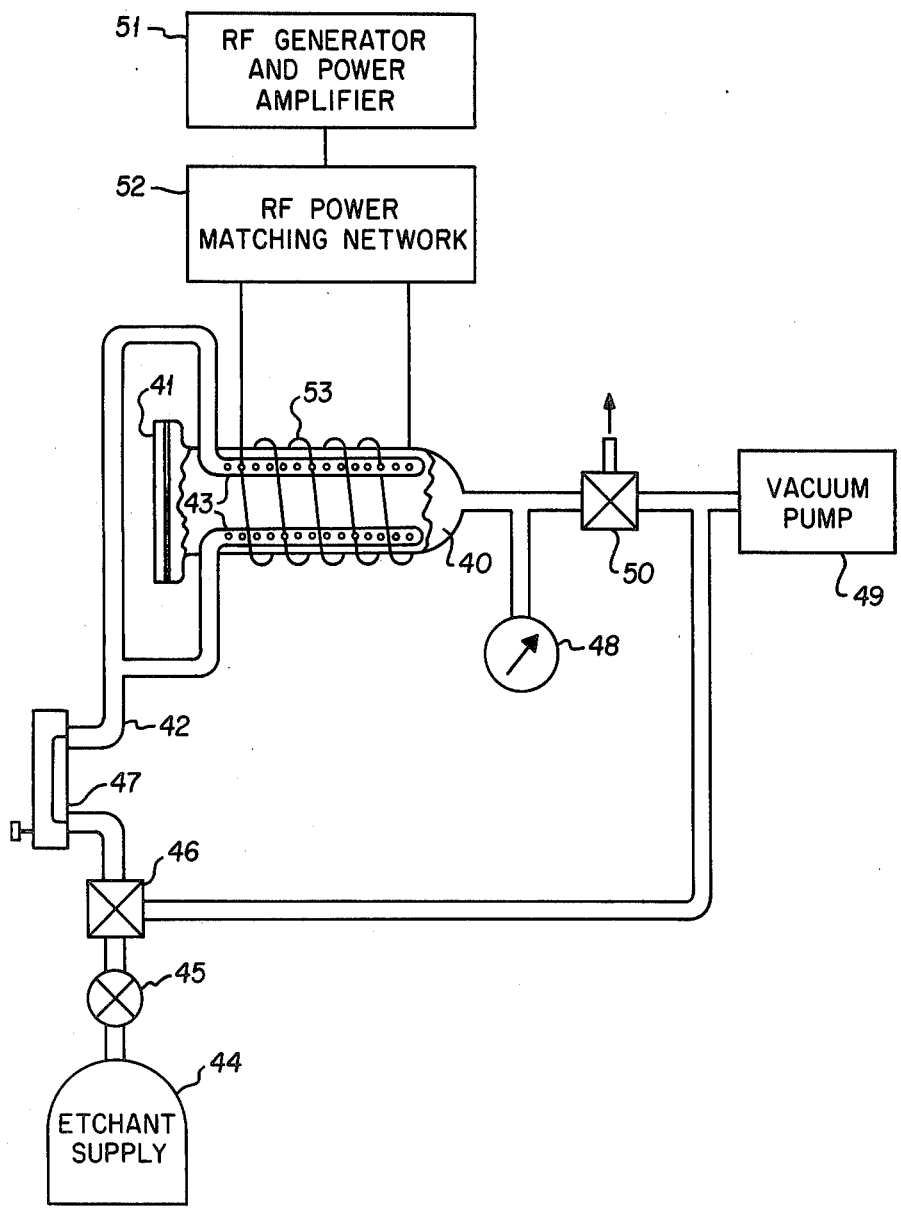
FIG. 8 is a schematic diagram of a plasma etching apparatus.

FIG. 8 shows another appropriate plasma etching apparatus. FIG. 8 shows the plasma etching apparatus contained to include a reactor chamber 40, typically made of quartz, and having a cover 41 and a gas inlet manifold 42. The side of reactor 40 has been partially broken away to better illustrate gas diffusion tubes 43 disposed therein and being externally connected to manifold 42.

The pressurized supply 44 of a binary gaseous mixture comprised of oxygen and a halocarbon gas is connected through pressure regulating valve 45, a three-way solenoide valve 46 and a flow meter 47 to manifold 42. The vacuum gauge 48 provides an indication of total reaction pressure in reactor 40. At any time, and prior to introduction of the gas mixture to manifold 42, the corresponding flow lines are constantly evacuated through the three-way solenoid valve 46 leading to the mechanical vacuum pump 49. Such is also accomplished where air and atmospheric pressure prevails in reactor 40 through the utilization of a three-way isolation valve 50. A source of radio frequency power 51 provides exciting energy through a matching network 52 to coil 53 which surrounds reaction chamber 40. The halocarbon utilized can be selected from the group of organohalides having no more than two carbon atoms per molecule and in which the carbon atoms are attached to a predominance of fluorine atoms. One preferred gaseous mixture for use in this apparatus is produced from a mixture containing approximately 8.5 volume percent oxygen and 91.5 volume percent tetrafluoromethane gas, both volume percents being based on the total volume of the gas mixture.

Through the generation in the reaction chamber the fluorocarbon-based plasma reacts with the exposed phosphorous peroxide, if any is present, and silicon material to combine therewith and thus etch such material as the etching occurs through this combination.

While in reaction chamber 40 of the plasma etching apparatus, the edge face p-n junctions of all wafers in the coin stack in the apparatus are removed and the desired front p-n junction electrically isolated as described hereinabove. Various changes can be made in the plasma etching process and apparatus to maximize the effect of the process with any given stack of wafers, such changes being obvious to those skilled in the art and being within this invention. For example, placement of the coin stacked wafers in reaction chamber 40, operating temperatures, pressures, etchant vapors, and the like can be varied by those skilled in the art and still remain within the scope of this invention. For example, the radio frequency power 500 watts can be employed using a carbontetrafluoride-oxygen or silicontetrafluoride-oxygen gas mixture as the etchant and about a 1 Torr pressure at 80° C. temperature, edge etching of 25 coin stacked wafers under these conditions taking only a matter of minutes, e.g., about three minutes.

FIG. 9 shows two coin stacked wafers 4 and 6 as they would appear in the coin stack of FIG. 7. FIG. 9 shows front contacts 25 for wafer 4 to be contiguous with back contact 60 of wafer 6, back contact 60 having been made on back side 16 of wafer 6. Front side 15 of wafer 6 has emplaced thereon a front contact grid network 61 similar to that shown for front grid network 25 of wafer 4 in FIG. 5. Similarly, back contact 60 is circular like back contact 26 of wafer 4 in FIG. 6. Wafer 6 has a front p-n junction 20 close to its front surface 15 and front contact 61. Edge 18 has an undesired edge face p-n junction 20″ similar to undesired edge face p-n junction 19″ for wafer 4. Further, as is obvious to one skilled in the art, there could be some front and/or back contact, 60 and 61, metal also overlapping on edge 18 which is also undesirable from an electrical shorting point of view. The edge etching technique of this invention can, depending on the plasma gas or gases used as is known in the art, remove any edge overlapping front and/or back contact metal as well as, for example, undesired edge face p-n junction 19″.

FIG. 9 shows coin stacked wafers 4 and 6 prior to plasma edge etching in accordance with this invention.

Figure 10:
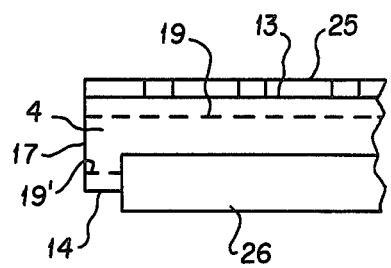
FIG. 10 shows an individual solar cell as it exists after being manufactured in accordance with the method of this invention.

FIG. 10 shows wafer 4 after the coin stacked wafers of FIG. 7 have been plasma etched in the apparatus of FIG. 8 under the conditions specified hereinabove. Wafer 4, after plasma edge etching is now an operational photovoltaic solar cell in that undesired edge face p-n junction 19″ has been removed from edge face 17 by the plasma edge etching step. The peripheral portion of back surface area 14 which is not covered by back contact 26 can have residual back p-n junction 19″ therein but this is of no concern since shunting edge face p-n junction 19″ has been removed. However, such a residual portion of back p-n junction 19″ can also be removed, depending upon the conditions of operation, by the plasma edge etching step of this invention, the residual portion of back p-n junction 19″ now showing to have been removed in FIG. 10 for sake of explanation.

Thus, wafer 4 is now an operational cell since front p-n junction 19 is now electrically isolated.

It is readily apparent from the foregoing that a much larger number of wafers can be plasma etched in accordance with this invention since there is no requirement that the wafers being plasma etched be spaced apart from one another singly or even in pairs, it being highly desirable, on the contrary, that the wafers to be etched are contiguous with one another and thus as closely packed as possible in the plasma reaction chamber. This very substantially increases the volume of wafers that can be plasma treated with a given apparatus or a given processing scheme and therefore is of substantial commercial advantage over prior art back etching processes, both chemical and plasma.

Figure 11:
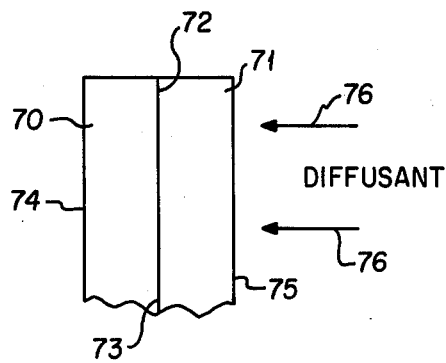
FIGS. 11 and 12 show another embodiment of the invention.

In the embodiment within this invention wherein a pair of contiguous wafers are employed in each slot 2 of boat 1, one pair of such wafers is shown in FIG. 11. FIG. 11 shows wafers 70 and 71 to be contiguous with one another at their large area surfaces 72 and 73 leaving outer, exposed large area surfaces 74 and 75. In this contacting configuration, wafer pair 70 and 71 and a plurality of other similarly contacting wafer pairs are employed in a boat similar to boat 1 in FIG. 1 and subjected to conventional diffusion practices by exposure to a gaseous, solid, or ion source of an active impurity of an opposite conductivity imparting type as represented by arrows 76 to thereby establish a p-n junction in wafers 70 and 71.

Figure 12:
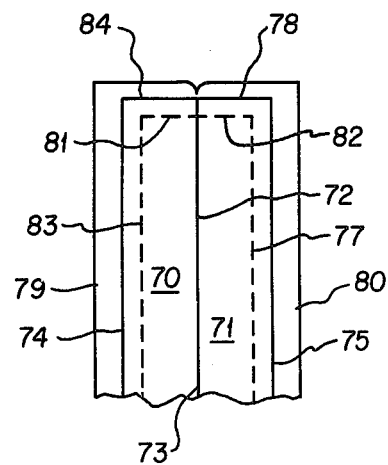

FIG. 12 shows wafers 70 and 71, after diffusion, to have a p-n junction established therein. For wafer 70 p-n junction 83 is established near front surface 74 and edge face 84. For wafer 71 a front p-n junction 77 is established near front surface 75 and edge face 78.

An active impurity compound, e.g., phosphorous pentoxide glass in the case of a phosphorous source, is formed on surface 74 and edge face 84 as represented by 79, a similar phosphorous oxide glass coating for surface 75 and edge face 78 of wafer 71 being represented by 80.

Although surfaces 72 and 73 being contiguous with one another tend to function as a diffusion mask, some diffusion gases do penetrate between wafers 70 and 71, mostly at the outer periphery of these wafers.

Normally at this stage of the process, wafers 70 and 71 would be back etched and front and back contacts applied after back etching. However, according to this invention, wafers 70 and 71 are not back etched, but rather have their active impurity compound layers 79 and 80 removed, front and back contacts attached and thereafter coin stacked and plasma edge etched as described hereinabove to remove edge face p-n junctions 81 and 82 of wafers 70 and 71, respectively, and electrically isolate front p-n junctions 83 and 77.

As noted hereinabove, the front and back contacts are formed in this invention in conventional manner such as by contact metallization. The front contact of this invention can be applied in any known manner such as by printing, evaporation, plating, or combinations thereof, using any known contact materials such as silver paste, nickel plating, evaporated titanium-palladium-silver, evaporated chromium-gold-silver, and the like.

Any back contact employed must contain sufficient amount of a material which will penetrate the back p-n junction to form low resistance ohmic contact as described above for the typical furnace diffusion process. Generally the back contact can be deposited by printing, plating, or evaporation and will contain one or more materials which penetrate the back p-n junction. A large variety of materials are used for this purpose and will be obvious to one skilled in the art as will the various mechanisms of operation of the various materials. For example, aluminum powder can be employed since the aluminum will alloy into the back p-n junction thus forming the desired penetration of the p-n junction with an ohmic contact. Similarly, gold, platinum, and palladium will diffuse through the silicon to form the desired ohmic contact with the silicon in the back. Further, conventional glass frit forms the desired ohmic contact through an oxidation process. Generally, at least about 0.05 weight percent, preferably at least about 2 weight percent of one or more materials, based on the total weight percent of the back contact material, is employed to penetrate the back p-n junction to form the desired ohmic contact. Generally, any known thick film conductor paste can be employed so long as it contains one or more of the penetrating and ohmic contact forming materials such as aluminum, gold, copper, nickel, palladium, platinum, and/or glass frit. As an example, $-325$ mesh aluminum powder can be employed in the range of from 0.05 weight percent to 100 weight percent and when fired at a temperature of at least 450° C. will alloy with the silicon to form the desired back contacts which penetrate into the interior of the silicon wafer as shown for back contact 26 of wafer 4 in FIGS. 9 and 10 and back contact 60 of wafer 6 in FIG. 9. As a further example, suitable contacts would be a silver paste containing about 5 weight percent glass frit while a suitable back contact is the same silver paste containing about 4 weight percent $-325$ mesh aluminum powder, the contacts being applied by silk screen printing after which they are fired in air at about 650° C. for more than fifteen seconds.

The photovoltaic cells used in this invention can be of any desired configuration, e.g., square, round, strip, etc., or mixture of configurations.

Reasonable variations and modifications are possible within the scope of this disclosure without departing from the spirit and scope of this invention.

The embodiments of the invention in which an exclusive property or privilege is claimed are defined as follows:

1. A method for manufacturing solar cells comprising:
    (a) introducing an active impurity of an opposite conductivity imparting type into at least one major face and the edge face of individual semiconductor wafers to establish a p-n junction therein;
    (b) forming front and back contacts on said wafers by metallization, said back contact material being chosen so that it penetrates any p-n junction present and forms a low resistance ohmic contact through any such junction;
    (c) coin stacking said contact containing wafers;
    (d) plasma etching the edge faces of said coin stacked wafers to remove sufficient p-n junction from said edge faces to electrically isolate said front p-n junction and
    (e) separating the stacked wafers into individual wafers.

2. The method according to claim 1 wherein said wafer is silicon.

3. The method according to claim 2 wherein said silicon wafer originally contains boron and phosphorous is the active impurity diffused into said boron containing wafer to establish said p-n junction.

4. The method according to claim 3 wherein a phosphorous pentoxide layer is formed on the surfaces of said wafers during diffusion and said layer is removed prior to said contact metallization.

5. The method according to claim 4 wherein phosphorous pentoxide layer is removed by a hydrofluoric acid treatment.

6. The method according to claim 3 wherein said back contact material contains at least 0.05 weight percent based on the total weight of said material of aluminum, gold, palladium, copper, nickel, platinum, glass frit, and combinations thereof.

7. The method according to claim 6 wherein said weight percent is at least 2 weight percent based on the total weight of said material.

8. The method according to claim 1 wherein when assembling said wafers prior to diffusion, each wafer is spaced apart from adjacent wafers on either side thereof.

9. The method according to claim 1 wherein when assembling said wafers prior to diffusion, said wafers are assembled in spaced apart pairs with adjacent surfaces of each pair in contact with one another.

10. The method according to claim 1 wherein said plasma edge etching step is performed with a mixture of tetrafluoromethane and oxygen.

11. The method according to claim 1 wherein any activity impurity compound formed on the surfaces of said wafers is removed before said front and back contacts are formed on said wafers in step (b).

* * * * *